(12) United States Patent
Lo

(10) Patent No.: US 7,081,372 B2
(45) Date of Patent: Jul. 25, 2006

(54) ALUMINUM CAP WITH ELECTROLESS NICKEL/IMMERSION GOLD

(75) Inventor: Marvin Lo, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 38 days.

(21) Appl. No.: 10/616,268

(22) Filed: Jul. 9, 2003

(65) Prior Publication Data

US 2005/0009289 A1   Jan. 13, 2005

(51) Int. Cl.
  *H01L 21/44*   (2006.01)
(52) U.S. Cl. .................. 438/106; 438/612; 438/613
(58) Field of Classification Search ........ 438/612–614, 438/106
See application file for complete search history.

(56) References Cited

U.S. PATENT DOCUMENTS

| 6,249,044 | B1 * | 6/2001 | Kao et al. ................ 257/678 |
| 6,426,281 | B1 | 7/2002 | Lin et al. ................. 438/612 |
| 6,452,270 | B1 | 9/2002 | Huang .................... 257/738 |
| 6,506,672 | B1 * | 1/2003 | Dagenais et al. ........... 438/612 |
| 6,521,996 | B1 | 2/2003 | Seshan .................... 257/737 |
| 6,780,761 | B1 * | 8/2004 | Wu et al. .................. 438/637 |

FOREIGN PATENT DOCUMENTS

EP   1148548 A2 * 10/2001

* cited by examiner

*Primary Examiner*—Long Pham

(57) ABSTRACT

A method of forming a solder bump (and the resulting solder bump structure), comprising the following steps. A structure having a metal bond pad formed thereover is provided. A patterned cover layer is formed over the structure. The patterned cover layer including an opening exposing a portion of the metal bond pad. The patterned cover layer opening including side walls. A metal cap layer is formed over at least the exposed portion of the metal bond pad and the patterned cover layer side walls. A solder bump is formed over the metal cap layer.

45 Claims, 2 Drawing Sheets

ALUMINUM CAP WITH ELECTROLESS NICKEL/IMMERSION GOLD

FIELD OF THE INVENTION

The present invention relates generally to fabrication of semiconductor devices, and more specifically to methods of fabricating wafer bumps.

BACKGROUND OF THE INVENTION

Electroless nickel/gold (Ni/Au) under bump metal (UBM) is a commonly used UBM for wafer bumping used in Flip Chip applications because it's a low cost maskless process. This process involves the dipping of silicon nitride ($Si_3N_4$)/polyimidecover/benzocyclobutene (BCB) passivated wafers into a series of plating baths to grow a thick layer of Ni studs (UBM). After this UBM process, the wafer is sent for bumping and reflow to form round solder ball interconnects.

However, the adhesion of this electroless Ni/Au UBM to the passivation layer is poor, and during plating, the plated Au will follow a capillary action and become deposited on the side wall of the PI/BCB passivation layer. During solder bump reflow, this will cause solder to flow into the side wall of the passivation layer as Au is proven to be a good wetting layer of solder. Thus, the solder will attack the underlying aluminum (Al) pad causing corrosion to the Al pad and affecting the reliability of the package.

U.S. Pat. No. 6,452,270 B1 to Huang describes increased adhesion between the UBM and passivation by using a Ti UBM with a closed-loop shape.

U.S. Pat. No. 6,521,996 B1 to Seshan describes a lower adhesion layer that provides good adhesion to the passivation layer.

U.S. Pat. No. 6,426,281 B1 to Lin et al. describes a passivation layer that increases the adhesion to the UBM.

SUMMARY OF THE INVENTION

Accordingly, it is an object of the present invention to provide improved methods of forming wafer bumps.

Other objects will appear hereinafter.

It has now been discovered that the above and other objects of the present invention may be accomplished in the following manner. Specifically, a structure having a metal bond pad formed thereover is provided. A patterned cover layer is formed over the structure. The patterned cover layer including an opening exposing a portion of the metal bond pad. The patterned cover layer opening including side walls. A metal cap layer is formed over at least the exposed portion of the metal bond pad and the patterned cover layer side walls. A solder bump is formed over the metal cap layer. The invention further includes a solder bump structure formed from this method.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The method of the present invention forms, inter alia, an additional layer of metal over the metal bond pad to prevent exposure of the cover side walls as the additional layer of metal covers up the cover side walls.

Figure 1:
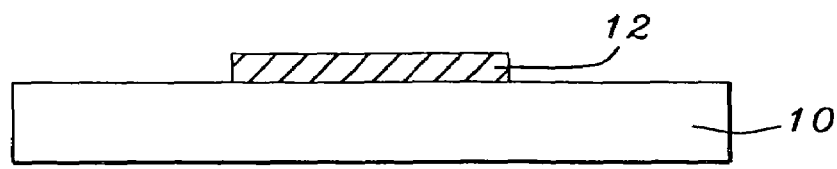
FIGS. 1 to 6 schematically illustrate a preferred embodiment of the present invention.

Initial Structure—FIG. 1

FIG. 1 schematically illustrates a structure 10 having a metal bond pad 12 formed thereover.

Structure 10 is preferably a semiconductor wafer comprised of silicon or germanium and is more preferably a silicon semiconductor wafer as will be used for illustrative purposes hereafter.

Metal bond pad 12 is preferably from about 0.5 to 1.5 μm thick and is more preferably from about 1.0 to 1.5 μm thick; and is preferably comprised of aluminum (Al) or AlSi and is more preferably aluminum (Al) as will be used for illustrative purposes hereafter.

Figure 2:
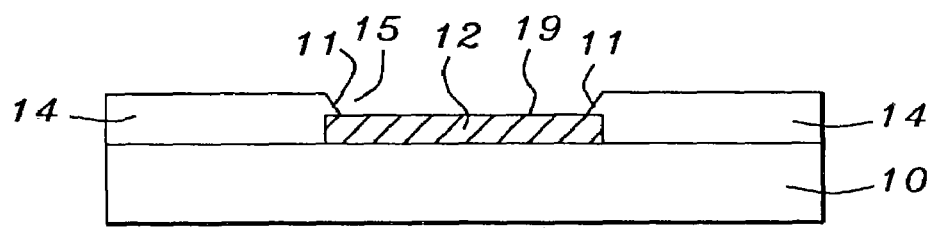

Formation of Patterned Cover Layer 14—FIG. 2

As shown in FIG. 2, a patterned cover polyimide layer 14 having opening 15 is formed over the Al bond pad 12, exposing a portion 19 of the Al bond pad 12. Cover layer 14 is preferably a polyimide/benzocyclobutene (BCB) stack as will be used hereafter for purposes of illustration.

Polyimide/benzocyclobutene (BCB) layer opening 15 includes exposed side walls 11. The polyimide/benzocyclobutene (BCB) layer 14 may be patterned to form the opening 15 by, for example, photolithography and etching. The patterned polyimide/benzocyclobutene (BCB) layer opening 15 has a width of preferably from about 30 to 90 μm and more preferably from about 30 to 60 μm.

Polyimide/benzocyclobutene (BCB)layer 14 has a combined thickness of preferably from about 5.0 to 10.0 μm and more preferably from about 5.0 to 6.0 μm.

Figure 3:
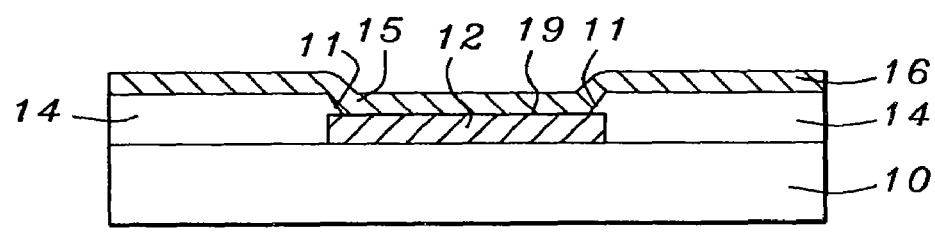

Formation of Additional Metal Layer 16—FIG. 3

As shown in FIG. 3, an additional metal layer 16 is formed over the Al bond pad 12, polyimide/benzocyclobutene (BCB) layer 14 and the side walls 11 of polyimide/benzocyclobutene (BCB) layer 14 to a thickness of preferably from about 0.5 to 1.0 μm and more preferably from about 0.8 to 1.0 μm. The additional metal layer 16 is preferably formed by sputtering.

Additional metal layer 16 is preferably comprised of aluminum (Al) or AlSi and is more preferably aluminum (Al) as will be used for illustrative purposes hereafter. Additional metal layer 16 is preferably comprised of the same metal as is the metal bond pad 12.

Figure 4:
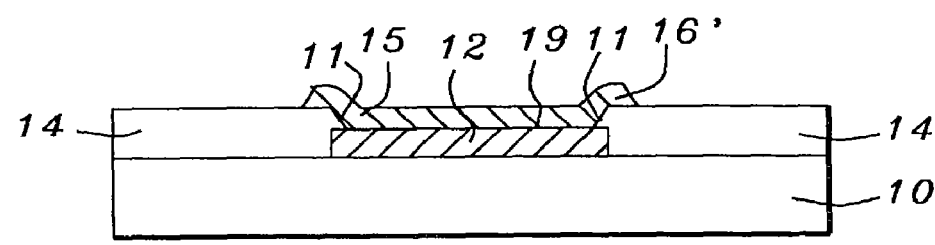

Patterning of Additional Al Layer 16—FIG. 4

As shown in FIG. 4, the additional Al layer 16 is patterned to form a patterned additional Al layer/Al cap layer 16' that at least covers the Al bond pad 12 and the side walls 11 of polyimide/benzocyclobutene (BCB) layer 14.

Figure 5:
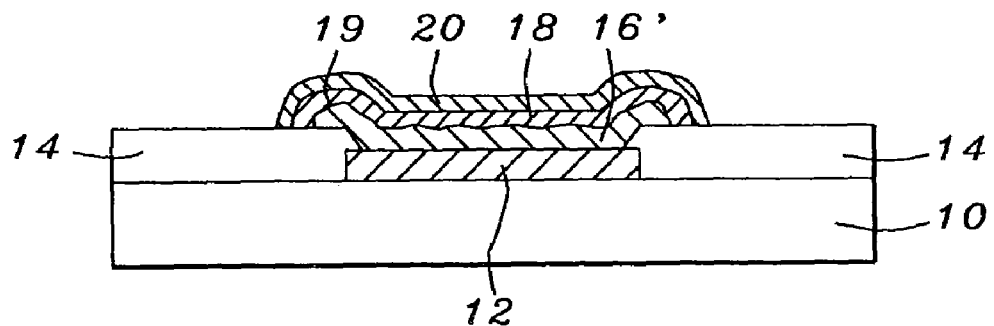

Double Zincation Process Activated Surface 19 and Electroless Nickel 18/Immersion Gold 20 Layers Over Al Cap Layer 16'—FIG. 5

As shown in FIG. 5, the Al cap layer 16' is subjected to a double zincation process to form:

a double zincation activated surface 19 on Al cap layer 16';

an electroless nickel layer 18 over the double zincation activated surface 19 of Al cap layer 16' to a thickness of preferably from about 4.8 to 5.2 μm and more preferably about 5.0 μm; and an immersion gold (Au) layer over the electroless nickel layer 18 to a thickness of preferably from about 0.09 to 0.11 µm and more preferably about 0.10 µm.

Figure 6:
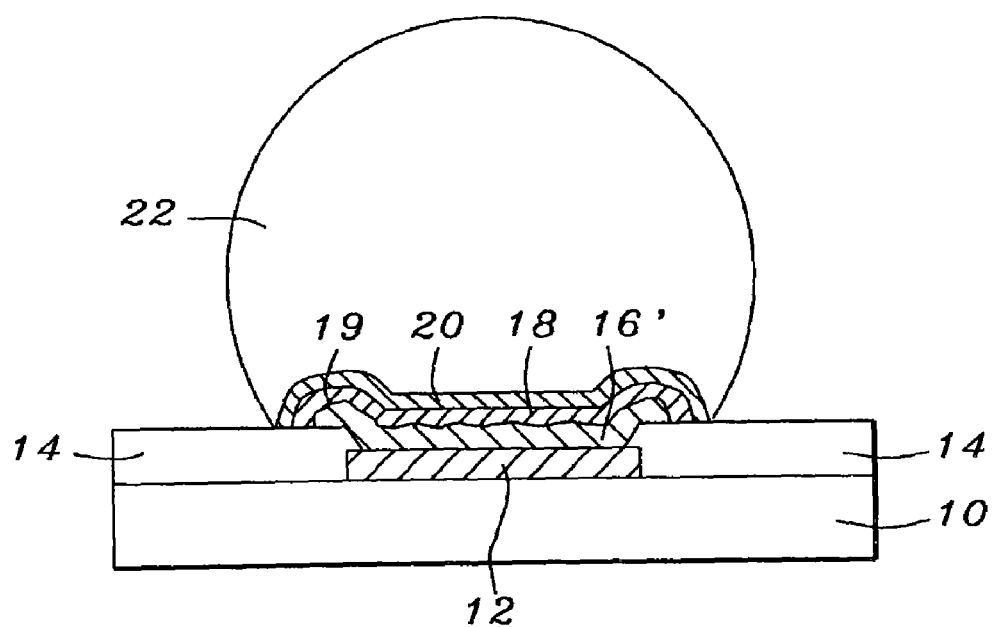

Formation of Rounded Solder Bump 22—FIG. 6

As shown in FIG. 6, a solder bump is formed over the immersion gold layer 20 and is then subjected to a reflow process to form rounded solder bump 22. Rounded solder bump 22 is preferably comprised of a tin lead alloy (SnPb), a tin silver copper alloy (SnAgCu), a tin silver alloy (SnAg) or a tin copper (SnCu) and is more preferably a tin silver copper alloy (SnAgCu).

It is noted that due to the formation of the Al cap layer 16' which is subjected to double zincation activated process to form: a double zincation active Al surface 19; an electroless nickel layer 18; and an immersion gold layer 20; there is no electroless nickel layer 18/immersion gold layer 20—polyimide interface so that the Al bond pad 12 is not subject to corrosion. Further, good adhesion between the Al bond pad/Al cap layer 16' and the polyimide is achieved, leading to improved reliability of the package.

The rounded solder bump 22 will come in contact with polyimide layer 14/BCB only at the edge of the under bump metal (UBM).

Advantages of the Invention

The advantages of one or more embodiments of the present invention include:

1) increased thickness of Al bond pad which could otherwise lead to serious pitting during the double zincation process; and 2) increased standoff (overall height) of solder bump thus improving reliability performance.

While particular embodiments of the present invention have been illustrated and described, it is not intended to limit the invention, except as defined by the following claims.

I claim:

1. A method of forming a solder bump, comprising the steps of:
    providing a structure;
    forming a metal bond pad on the structure;
    forming a patterned cover layer over the structure; the patterned cover layer including an opening exposing a portion of the metal bond pad; the patterned cover layer opening including side walls; the patterned cover layer being comprised of a polyimide/benzocyclobutene stack;
    forming a metal cap layer over at least the exposed portion of the metal bond pad and the patterned cover layer side walls; and
    forming a solder bump over the metal cap layer.

2. The method of claim 1, wherein the structure is a semiconductor wafer.

3. The method of claim 1, wherein the structure is comprised of silicon or germanium.

4. The method of claim 1, wherein the metal bond pad is comprised of aluminum or AlSi; the metal cap layer is comprised of aluminum or AlSi; and the solder bump is comprised of a tin lead alloy (SnPb), a tin silver copper alloy (SnAgCu), a tin silver alloy (SnAg) or a tin copper (SnCu).

5. The method of claim 1, wherein the metal bond pad is comprised of aluminum; the metal cap layer is comprised of aluminum; and the solder bump is comprised of a tin silver copper alloy (SnAgCu).

6. The method of claim 1, wherein the metal bond pad and the metal cap layer are each comprised of the same metal.

7. The method of claim 1, wherein the metal bond pad has a thickness of from about 0.5 to 1.5 µm; the patterned cover layer has a thickness of from about 5.0 to 10.0 µm; and the metal cap layer has a thickness of from about 0.5 to 1.0 µm.

8. The method of claim 1, wherein the metal bond pad has a thickness of from about 1.0 to 1.5 µm; the patterned cover layer has a thickness of from about 5.0 to 6.0 µm; and the metal cap layer has a thickness of from about 0.8 to 1.0 µm.

9. The method of claim 1, wherein the patterned cover layer opening has a width of from about 30 to 90 µm.

10. The method of claim 1, wherein the patterned cover layer opening has a width of from about 30 to 60 µm.

11. The method of claim 1, wherein the metal cap layer is formed by sputtering.

12. The method of claim 1, including the step of:
    subjecting the metal cap layer to a double zincation process.

13. The method of claim 1, including the step of subjecting the metal cap layer to a double zincation process to form:
    a double zincation activated surface on the metal cap layer,
    an electroless nickel layer on the double zincation activated surface; and
    an immersion gold layer on the electroless nickel layer.

14. The method of claim 1, including the step of subjecting the metal cap layer to a double zincation process to form:
    a double zincation activated surface on the metal cap layer;
    an electroless nickel layer on the double zincation activated surface; the electroless nickel layer having a thickness of about 4.8 to 5.2 µm; and
    an immersion gold layer on the electroless nickel layer; the immersion gold layer having a thickness of about 0.09 to 0.11 µm.

15. The method of claim 1, including the step of subjecting the metal cap layer to a double zincation process to form:
    a double zincation activated surface on the metal cap layer;
    an electroless nickel layer on the double zincation activated surface; the electroless nickel layer having a thickness of about 5.0 µm; and
    an immersion gold layer on the electroless nickel layer; the immersion gold layer having a thickness of about 0.10 µm.

16. The method of claim 1, including the step of reflowing the solder bump to form a rounded solder bump.

17. A method of forming a solder bump, comprising the steps of:
    providing a structure;
    forming a metal bond pad on the structure;
    forming a patterned cover layer over the structure; the patterned cover layer including an opening exposing a portion of the metal bond pad; the patterned cover layer opening including side walls; the patterned cover layer being comprised of a polyimide/benzocyclobutene stack;
    forming a metal cap layer over at least the exposed portion of the metal bond pad and the patterned cover layer side walls;
    subjecting the metal cap layer to a double zincation process; and
    forming a solder bump over the metal cap layer.

18. The method of claim 17, wherein the structure is a semiconductor wafer.

19. The method of claim 17, wherein the structure is comprised of silicon or germanium.

20. The method of claim 17, wherein the metal bond pad is comprised of aluminum or AlSi; the metal cap layer is comprised of aluminum or AlSi; and the solder bump is comprised of a tin lead alloy (SnPb), a tin silver copper alloy (SnAgCu), a tin silver alloy (SnAg) or a tin copper (SnCu).

21. The method of claim 17, wherein the metal bond pad is comprised of aluminum; the metal cap layer is comprised of aluminum; and the solder bump is comprised of a tin silver copper alloy (SnAgCu).

22. The method of claim 17, wherein the metal bond pad and the metal cap layer are each comprised of the same metal.

23. The method of claim 17, wherein the metal bond pad has a thickness of from about 0.5 to 1.5 µm; the patterned cover layer has a thickness of from about 5.0 to 10.0 µm; and the metal cap layer has a thickness of from about 0.5 to 1.0 µm.

24. The method of claim 17, wherein the metal bond pad has a thickness of from about 1.0 to 1.5 µm; the patterned cover layer has a thickness of from about 5.0 to 6.0 µm; and the metal cap layer has a thickness of from about 0.8 to 1.0 µm.

25. The method of claim 17, wherein the patterned cover layer opening has a width of from about 30 to 90 µm.

26. The method of claim 17, wherein the patterned cover layer opening has a width of from about 30 to 60 µm.

27. The method of claim 17, wherein the metal cap layer is formed by sputtering.

28. The method of claim 17, wherein the subjection of the metal cap layer to a double zincation process forms:
   a double zincation activated surface on the metal cap layer;
   an electroless nickel layer on the double zincation activated surface; and
   an immersion gold layer on the electroless nickel layer.

29. The method of claim 17, wherein the subjection of the metal cap layer to a double zincation process forms:
   a double zincation activated surface on the metal cap layer;
   an electroless nickel layer on the double zincation activated surface; the electroless nickel layer having a thickness of from about 4.8 to 5.2 µm; and
   an immersion gold layer on the electroless nickel layer; the immersion gold layer having a thickness of from about 0.09 to 0.11 µm.

30. The method of claim 17, wherein the subjection of the metal cap layer to a double zincation process forms:
   a double zincation activated surface on the metal cap layer;
   an electroless nickel layer on the double zincation activated surface; the electroless nickel layer having a thickness of about 5.0 µm; and
   an immersion gold layer on the electroless nickel layer; the immersion gold layer having a thickness of about 0.10 µm.

31. The method of claim 17, including the step of reflowing the solder bump to form a rounded solder bump.

32. A method of forming a solder bump, comprising the steps of:
   providing a structure;
   forming a metal bond pad on the structure;
   forming a patterned cover layer over the structure; the patterned cover layer including an opening exposing a portion of the metal bond pad; the patterned cover layer opening including side walls; the patterned cover layer being comprised of a polyimide/benzocyclobutene stack;
   forming a metal cap layer over at least the exposed portion of the metal bond pad and the patterned cover layer side walls;
   subjecting the metal cap layer to a double zincation process to form:
      a double zincation activated surface on the metal cap layer;
      an electroless nickel layer on the double zincation activated surface; and
      an immersion gold layer on the electroless nickel layer; and
   forming a solder bump over the immersion gold layer.

33. The method of claim 32, wherein the structure is a semiconductor wafer.

34. The method of claim 32, wherein the structure is comprised of silicon or germanium.

35. The method of claim 32, wherein the metal bond pad is comprised of aluminum or AlSi; the metal cap layer is comprised of aluminum or AlSi; and the solder bump is comprised of a tin lead alloy (SnPb), a tin silver copper alloy (SnAgCu), a tin silver alloy (SnAg) or a tin copper (SnCu).

36. The method of claim 32, wherein the metal bond pad is comprised of aluminum; the metal cap layer is comprised of aluminum; and the solder bump is comprised of a tin silver copper alloy (SnAgCu).

37. The method of claim 32, wherein the metal bond pad and the metal cap layer are each comprised of the same metal.

38. The method of claim 32, wherein the metal bond pad has a thickness of from about 0.5 to 1.5 µm; the patterned cover layer has a thickness of from about 5.0 to 10.0 µm; and the metal cap layer has a thickness of from about 0.5 to 1.0 µm.

39. The method of claim 32, wherein the metal bond pad has a thickness of from about 1.0 to 1.5 µm; the patterned cover layer has a thickness of from about 5.0 to 6.0 µm; and the metal cap layer has a thickness of from about 0.8 to 1.0 µm.

40. The method of claim 32, wherein the patterned cover layer opening has a width of from about 30 to 90 µm.

41. The method of claim 32, wherein the patterned cover layer opening has a width of from about 30 to 60 µm.

42. The method of claim 32, wherein the metal cap layer is formed by sputtering.

43. The method of claim 32, including the step of reflowing the solder bump to form a rounded solder bump.

44. The method of claim 32, wherein:
   the electroless nickel layer has a thickness of from about 4.8 to 5.2 µm; and
   the immersion gold layer having a thickness of from about 0.09 to 0.11 µm.

45. The method of claim 32, wherein:
   the electroless nickel layer has a thickness of about 5.0 µm; and
   the immersion gold layer having a thickness of about 0.10 µm.

* * * * *